(12) United States Patent
Iwasaki et al.

(10) Patent No.: US 7,307,290 B2
(45) Date of Patent: Dec. 11, 2007

(54) COMPOUND SEMICONDUCTOR WAFER AND MANUFACTURING METHOD THEREOF

(75) Inventors: Takashi Iwasaki, Itami (JP); Shigeru Sawada, Itami (JP); Hiroya Kimura, Itami (JP); Kenji Ohki, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 10/514,973

(22) PCT Filed: Apr. 13, 2004

(86) PCT No.: PCT/JP2004/005281

§ 371 (c)(1),
(2), (4) Date: Nov. 17, 2004

(87) PCT Pub. No.: WO2004/093201

PCT Pub. Date: Oct. 28, 2004

(65) Prior Publication Data

US 2005/0242372 A1 Nov. 3, 2005

(30) Foreign Application Priority Data

Apr. 16, 2003 (JP) ............................. 2003-111748

(51) Int. Cl.
*H01L 29/732* (2006.01)
(52) U.S. Cl. ............... 257/184; 257/613; 257/E31.022; 257/E31.059; 438/57
(58) Field of Classification Search ............... 257/184, 257/613; 438/57
See application file for complete search history.

(56) References Cited

U.S. PATENT DOCUMENTS

| 5,387,796 A | 2/1995 | Joshi et al. |
| 5,471,076 A | 11/1995 | Murakami et al. |
| 5,656,831 A * | 8/1997 | Kusakabe .................. 257/186 |

(Continued)

FOREIGN PATENT DOCUMENTS

EP        0 470 783        2/1992

(Continued)

OTHER PUBLICATIONS

Linga et al., "Dark current Analysis and characterization of InxGa1-xAs/InAsyP1-y Graded Photodiodes with X>0.53 for Reponse to Longer Wavelengths (>1.7 p m)" JouRNAL of Lightwave Technology, vol. 10, No. 8, Aug. 1992, pp. 1050-1054.*

(Continued)

*Primary Examiner*—A. Sefer
(74) *Attorney, Agent, or Firm*—W. F. Fasse; W. G. Fasse

(57) ABSTRACT

A compound semiconductor wafer providing an InGaAs light receiving layer having superior crystal characteristic suitable for a near-infrared sensor includes an $InAs_xP_{1-x}$ graded buffer layer consisting of a plurality of layers positioned on an InP substrate and an $InAs_yP_{1-y}$ buffer layer positioned on the graded buffer layer, sandwiched between said InP substrate and the InGaAs layer, wherein maximum value of PL light emission intensity at an interface of each of the layers of the graded buffer layer and the buffer layer is, at every interface, smaller than 3/10 of the maximum PL light emission intensity of the buffer layer.

13 Claims, 11 Drawing Sheets

U.S. PATENT DOCUMENTS 6,835,990 B2 * 12/2004 Iguchi et al. ............... 257/435
2005/0161697 A1 * 7/2005 Nakahata et al. ........... 257/103

FOREIGN PATENT DOCUMENTS

| JP | 06-216403 | 8/1994 |
|---|---|---|
| JP | 10-012914 | 1/1998 |
| JP | 2001-102620 | 4/2001 |
| JP | 2001-156324 | 6/2001 |
| JP | 2001-250976 | 9/2001 |
| JP | 2002-373999 | 12/2002 |

OTHER PUBLICATIONS

Krishna R. Linga et al., "Dark Current Analysis and Characterization on $In_xGa_{1-x}As$ / $InAs_yP_{1-y}$ Graded Photodiodes with X>0.53 for Reponse to Longer Wavelengths (>1.7 μm)", Journal of Lightwave Technology, vol. 10, No. 8, Aug. 1992, pp. 1050 to 1054.
Isamu Akasaki; "Advanced Electronics Series I-1 Group III-V Compound Semiconductor"; Baifukan Co., Ltd.; May 20, 1994; First Edition; p. 85; Partial English Translation.

* cited by examiner

COMPOUND SEMICONDUCTOR WAFER AND MANUFACTURING METHOD THEREOF

TECHNICAL FIELD

The present invention relates to a compound semiconductor wafer for a near-infrared sensor for food, medical or environmental inspection, as well as to a method of manufacturing the same.

BACKGROUND ART

As a near-infrared sensor having sensitivity in the near-infrared wavelength range of 1.7 μm to 2.6 μm, one having such a structure has been known in that a p-type semiconductor layer is formed by diffusing zinc in an epitaxial wafer having an $In_zGa_{1-z}As$ layer (hereinafter referred to as an InGaAs layer) with large lattice constant as a light receiving layer, and positive and negative electrodes are arranged on upper and lower surfaces thereof. Many substances surrounding us, including organic substances, water, gas and the like absorb waves having the wavelength in the near-infrared range of 1.7 μm to 2.6 μm, and therefore, such a sensor is expected to have wide applications in the field of environmental inspection, medical inspection, food analysis, temperature detection and the like.

In the near-infrared sensor described above, on an InP substrate, an InGaAs light receiving layer having a lattice constant larger than that of the InP substrate is formed. Therefore, the difference in lattice constant is adjusted by providing, between the InP substrate and the InGaAs light receiving layer, a plurality of step layers and a buffer layer formed thereon to be in contact with InGaAs layer. An epitaxial wafer having a lattice constant different from that of the substrate is referred to as a lattice mismatch type epitaxial wafer. The structure in which the step layers and a buffer layer are inserted between the substrate and the light receiving layer described above has been proposed repeatedly (for example, in Japanese Patent Laying-Open Nos. 2001-156324, 2001-102620 and 06-216403), since it has been found that the InGaAs layer has sensitivity in the near-infrared range.

DISCLOSURE OF THE INVENTION

In a ternary compound semiconductor consisting of (group 3/group 3/group 5) elements, a band gap is determined uniquely by its composition or by the lattice constant that is determined by the composition. Therefore, the ratio of elements of InAsP constituting each of the step layers and the buffer layer is varied to gradually increase the lattice constant as described above, so that the lattice constant is varied from that of InP substrate to a desired lattice constant of the InGaAs light receiving layer.

As a method of growing a lattice mismatch type epitaxial wafer for the near-infrared sensor, vapor deposition such as OMVPE (Organo Metallic Vapor Phase Epitaxy) or VPE (Vapor Phase Epitaxy) has been known. Among these, VPE method is known to have high growth rate.

However, even when the light receiving layer of InGaAs is formed with the step layers provided to have gradually increasing lattice constant as described above, it has been difficult to stably manufacture an InGaAs layer having a satisfactory crystal characteristic. This results in large dark current, and therefore, though near-infrared sensors of low sensitivity could be obtained, stable, highly sensitive and low-noise products could not be obtained.

An object of the present invention is to provide a compound semiconductor wafer and manufacturing method thereof that enable stable manufacture of an InGaAs light receiving layer having superior crystal characteristic.

The present invention provides a compound semiconductor wafer including an InGaAs layer as a light receiving layer formed on an InP substrate. The wafer includes an $InAs_xP_{1-x}$ step layer consisting of a plurality of layers (x differs layer by layer) formed in contact with and on the InP substrate, and an $InAs_yP_{1-y}$ buffer layer positioned in contact with and on the step layer, sandwiched between the InP substrate and the InGaAs layer. The plurality of step layers and the buffer layer have mutually different lattice constants that gradually become closer from that of the InP layer to that of the InGaAs layer. Further, the maximum value of PL light emission intensity at the interface of each of the plurality of step layers and the buffer layer is, at every interface, smaller than 3/10 of the maximum PL light emission intensity of the buffer layer.

The PL light emission intensity reflects crystal characteristic of the portion that emits light, and the PL light emission intensity becomes higher at a portion having higher crystal characteristic. In the structure described above, the crystal characteristic at the interface of the step layers and the buffer layer is deteriorated as edge dislocations and threading dislocations are concentrated, while the crystal characteristic in the buffer layer is three times or more higher than that of the interface, as indicated by PL light emission intensity. In such a stacked structure, misfit dislocations are not transferred from the interface to the upper layer. That the misfit dislocations are not transferred to the upper layer has been confirmed by the inventors of the present invention by inspection with TEM (Transmission Electron Microscopy). If the thickness of the upper layer is not larger than a prescribed thickness, good crystal characteristic cannot be expected because of the disorder at the interface as an underlying layer. If the thickness is large enough not to be influenced by the disorder of the interface, however, an epitaxial film having very high crystal characteristic can be obtained. Typically, the thickness of the buffer layer mentioned above is about twice that of each step layer.

As to the maximum value of the PL light emission intensity, the PL light emission intensity of a prescribed area of a wafer is measured. The measured PL light emission intensity is classified into about ten levels, and an average value of the highest level intensity is used as the maximum value.

According to another aspect, the present invention provides a compound semiconductor wafer including an InGaAs layer as a light receiving layer formed on an InP substrate. The wafer includes an $InAs_xP_{1-x}$ step layer consisting of a plurality of layers formed in contact with and on the InP substrate, and an $InAs_yP_{1-y}$ buffer layer positioned in contact with and on the step layer, sandwiched between the InP substrate and the InGaAs layer. The plurality of step layers and the buffer layer have mutually different lattice constants that gradually become closer from that of the InP layer to that of the InGaAs layer. Further, the maximum value of PL light emission intensity of the step layers is, in every layer, not larger than 7/10 of the maximum PL light emission intensity of the buffer layer.

This structure is assembled in view of crystal characteristic inside the step layers and the buffer layer. The ratio between the PL light emission intensity inside the step layers to that inside the buffer layer becomes smaller than in a conventional example. This means that the buffer layer farther from the InP substrate has better crystal characteristic than the step layers that are thinner and closer to the InP substrate.

According to a further aspect, the present invention provides a compound semiconductor wafer including an InGaAs layer as a light receiving layer formed on an InP substrate. The wafer includes an $InAs_xP_{1-x}$ step layer consisting of a plurality of layers formed in contact with and on the InP substrate, and an $InAs_yP_{1-y}$ buffer layer positioned in contact with and on the step layer, sandwiched between the InP substrate and the InGaAs layer. The plurality of step layers and the buffer layer have mutually different lattice constants that gradually become closer from that of the InP layer to that of the InGaAs layer. The maximum PL light emission intensity of at least the first step layer that is in contact with the InP substrate among the plurality of step layers is smaller then $1/10$ of the maximum PL light emission intensity of the buffer layer.

In the above described structure, defects are concentrated in a layer or layers close to the InP substrate such as the first step layer that is in contact with the InP substrate, both inside the layer and at the interface. Therefore, distortion is released at least in the first step layer, and not propagated to an upper layer. As a result, an epitaxial film having superior crystal characteristic can be formed at the buffer layer or light receiving layer as the upper layer, whereby dark current resulting from crystal defects can be suppressed and a highly sensitive near-infrared sensor can be obtained.

The PL light emission intensity of the second step layer positioned on and in contact with the first step layer may also be smaller than $1/10$ of the peak PL light emission of the buffer layer.

According to a still further aspect, the present invention provides a compound semiconductor wafer including an $In_zGa_{1-z}As$ layer as a light receiving layer formed on an InP substrate. The wafer includes an $InAs_xP_{1-x}$ step layer consisting of a plurality of layers formed in contact with and on the InP substrate, and an $InAs_yP_{1-y}$ buffer layer positioned in contact with and on the step layer, sandwiched between the InP substrate and the $In_zGa_{1-z}As$ layer. The plurality of step layers and the buffer layer have mutually different lattice constants that gradually become closer from that of the InP layer to that of the $In_zGa_{1-z}As$ layer. The peak composition ratio of As and/or P of at least one interface between each of the plurality of step layers and the buffer layer is closer to the corresponding composition ratio of the InP substrate than the corresponding composition ratio of the step layer that is in contact with the interface of interest on the side of the InP substrate and that of the step layer that is in contact with the step layer on the side of the InP substrate.

In this structure, the step layers are formed with compositions adjusted so as to attain matching lattice constant from the InP substrate to the buffer layer, while the compositions at the interfaces are reverse to such adjustment. As the composition is in one-to-one correspondence with the lattice constant, it follows that the lattice constants at the interface are adverse to each other, resulting in misfit dislocation concentration at the interface. When the misfit dislocations are concentrated at the interface, misfit dislocations in the step layers and in the buffer layer decrease, and therefore, a light receiving layer having superior crystal characteristic can be obtained.

The present invention provides a method of manufacturing a compound semiconductor wafer that includes an InGaAs layer as a light receiving layer formed on an InP substrate, an $InAs_xP_{1-x}$ step layer consisting of a plurality of layers formed in contact with and on the InP substrate, and an $InAs_yP_{1-y}$ buffer layer positioned in contact with and on the step layer, sandwiched between the InP substrate and the InGaAs layer. The plurality of step layers and the buffer layer have mutually different lattice constants that gradually become closer from that of the InP layer to that of the InGaAs layer. In manufacturing such a compound semiconductor wafer, growth is interrupted every time each of the plurality of step layers and the buffer layer is formed.

As the growth is interrupted as described above, steepness in composition variation that vary layer by layer among the step layers and the buffer layer can be made higher. The steep transition of compositions at the interface of each layer also increases steepness in lattice constant variation, and therefore, it acts to suppress extension or propagation of defects described above.

Here, growth interruption refers to a state in which growth is stopped for a prescribed time period, for example one minute or longer, and the wafer is held in that state. Specifically, the growth is stopped by stopping supply of the material gas to the substrate for growth for a prescribed time period, the material gas to be supplied to the substrate is adjusted to surely have a prescribed composition during that period, and the supply of the material gas to the substrate is resumed. By such growth interruption, an interface can be obtained at which composition and lattice constant vary steeply.

The foregoing and other objects, features, aspects and advantages of the present invention will become more apparent from the following detailed description of the present invention when taken in conjunction with the accompanying drawings.

BEST MODES FOR CARRYING OUT THE INVENTION

Figure 1:
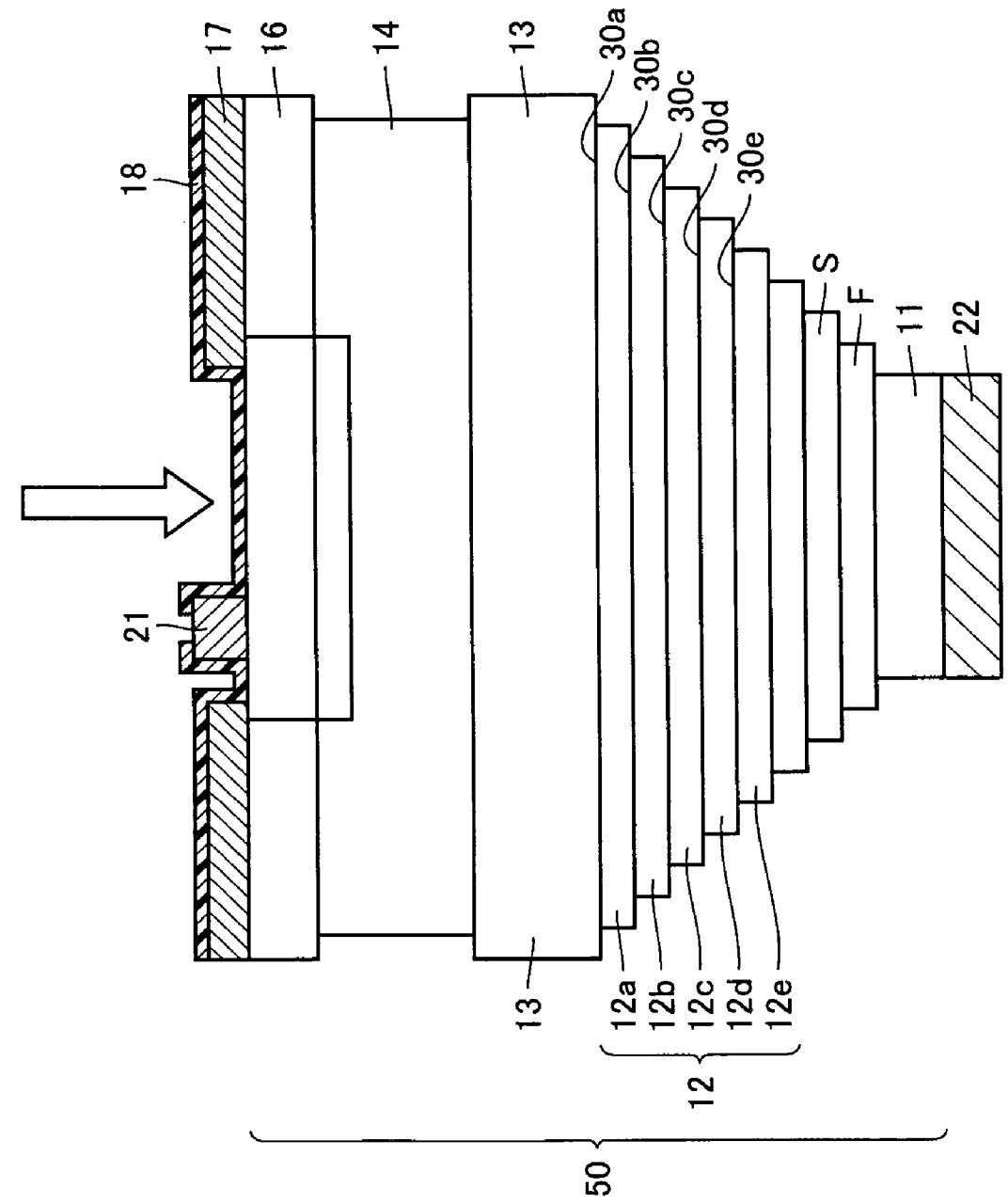
FIG. 1 represents a near-infrared sensor incorporating a compound semiconductor wafer in accordance with the present invention.

In the following, an embodiment of the present invention will be described with reference to the figures. FIG. 1 is a cross sectional view showing a near-infrared sensor using a compound semiconductor wafer in accordance with the present invention. In compound semiconductor wafer 50, on an InP substrate 11, a step layer 12 of InAsP is formed, and a buffer layer 13 of $InAs_{0.6}P_{0.4}$ is farther arranged thereon. Step layer 12 and buffer layer 13 are arranged to make smooth the difference in lattice constant between a light receiving layer 14 of $In_{0.82}Ga_{0.18}As$ and the InP substrate.

Step layer 12 includes a number of layers, and composition of each layer is selected such that a layer closer to the light receiving layer comes to have larger lattice constant. In FIG. 1, the layers are denoted by 12a, 12b, 12c, . . . from the one closer to buffer layer 13 toward the InP substrate. Further, the step layer that is positioned on and in contact with the InP substrate is denoted as a first step layer F, and a second step layer S is arranged on and in contact with the first step layer. In the embodiment of the present invention, what is important is whether PL light emission occurs in the first step layer F and the second step layer S. Further, in the compound semiconductor wafer of the present embodiment, what is important is the interface of the step layers and the buffer layer. As shown in FIG. 1, these interfaces are denoted by 30a, 30b, 30c, . . . from the buffer layer toward the InP substrate.

PL light emission occurs when portions of compound semiconductor wafer 50 are irradiated with light. In the present embodiment, the maximum value of PL light emission intensity at the interface of each of the plurality of step layers and the buffer layer is, at every interface, smaller than $3/10$ of the peak intensity of PL light emission of the buffer layer.

As a modification, the maximum value of PL light emission intensity of the plurality of step layers may be not higher than $7/10$ of the maximum value of PL light emission of the buffer layer.

Further, as another modification, the maximum value of PL light emission intensity of at least the first step layer positioned on and in contact with the InP substrate among the plurality of step layers is smaller than $1/10$ of the peak intensity of PL light emission of the buffer layer. In this case, the maximum value of PL light emission intensity of the second step layer positioned on and in contact with the first step layer may be smaller than $1/10$ of the peak intensity of PL light emission of the buffer layer.

In order to use compound semiconductor wafer 50 described above as a near-infrared sensor, first, a Zn diffusion mask is arranged on a window layer 16. Thereafter, an n-type electrode 22 is formed to be in ohmic contact with a rear surface of InP substrate 11, and a p-type electrode 21 is formed to be in ohmic contact with window layer 16. Thereafter, an anti-reflection film 18 is formed thereon for coverage.

Near-infrared incident light passes through window layer 16, and excites electrons in the valence band in light receiving layer 14. Consequently, a current flows between p-type electrode 21 and n-type electrode 22, to attain the function of a near-infrared sensor.

Figure 2:
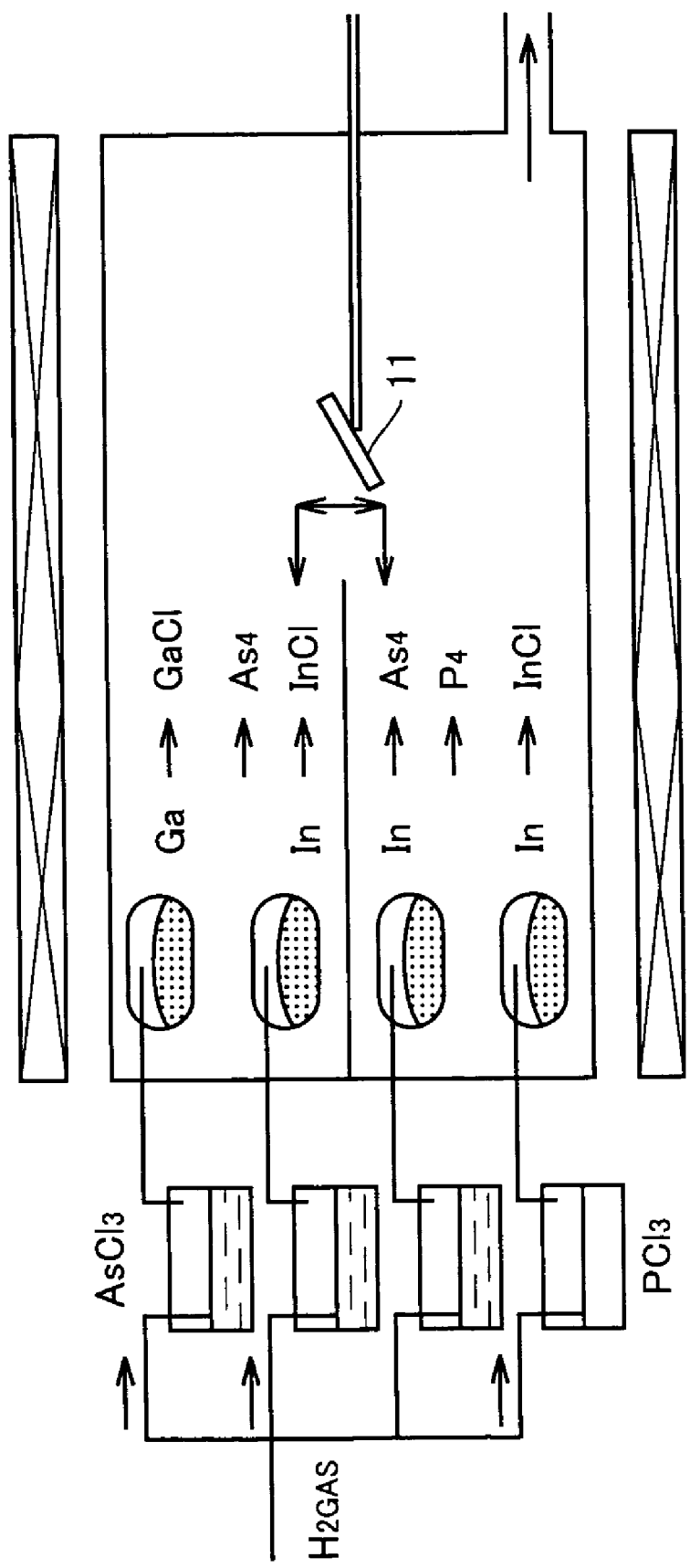
FIG. 2 represents a film forming apparatus used for manufacturing a compound semiconductor wafer in accordance with an embodiment of the present invention.

FIG. 2 shows a method of manufacturing the compound semiconductor wafer in accordance with the present invention. The apparatus shown in FIG. 2 is a chloride vapor deposition apparatus. According to the chloride method, hydrogen is used as a carrier gas, and when an InGaAs film is to be formed, $AsCl_3$ is introduced to the apparatus. In the apparatus, $AsCl_3$ and $H_2$ are thermally decomposed to $As_4$ and HCl. HCl separately reacts to Ga and In, generating GaCl and InCl, whereby an InGaAs film can be formed on the substrate. When the composition is to be varied, the amount of $AsCl_3$ to be reacted with Ga or the amount of $AsCl_3$ to be reacted with In is changed. When an InAsP film is to be formed, hydrogen gas is used as a carrier gas as in the case described above, and separate reactions to $AsCl_3$ and $PCl_3$ are induced, so that an InAsP film is formed on the substrate. Compositions of As and P of the InAsP film are controlled by adjusting the amount of supplied material gas.

In the chloride method, the growth rate is as high as 5 times that of the conventionally used OMVPE Organo Metallic Vapor Phase Epitaxy method. Therefore, it is advantageous in forming a thick layer, and a film having good crystal characteristic can be obtained.

The apparatus shown in FIG. 2 has the following characteristics.

(1) A film forming space for the InAsP film is separated from a film forming space for the InGaAs film, by a screen-type partition.

(2) At the time of film formation, it is possible to independently form a film or to interrupt growth, with the substrate arranged in either one of the film forming spaces. Particularly, it is possible to form the step layer of a prescribed composition and thereafter to interrupt growth. At this time, the substrate, on which the film has just been formed, may be covered by a protection plate to quickly shield from the material gas. Therefore, the time period in which the substrate is exposed to the material gas of which composition is being varied can be eliminated.

Next, when a step layer of a different composition is to be formed, after the adjustment of material gas composition is finished and prescribed desired composition is attained, the protection plate may be removed and the material gas as such can be supplied to the substrate.

Consequently, the steepness in composition variation at the interface can be improved, and therefore, steepness in the lattice constant variation can also be improved. As a result, misfit dislocations and the like can be concentrated at the interface, so that extension or propagation of dislocations and the like to an adjacent layer can be prevented. Thus, a light receiving layer having superior crystal characteristic can be obtained.

EXAMPLES

Using the chloride VPE apparatus shown in FIG. 2, compound semiconductor wafer 50 shown in FIG. 1 was manufactured. The object wavelength of the light to be received by the light receiving layer, that is, the PL light emission wavelength was, by way of example, 2200 nm. The PL light emission wavelength of the buffer layer will be indicated in FIG. 11, which will be described later. Further, an n-type impurity is introduced to be 1E+18 or higher, in the $InAs_xP_{1-x}$ step layer 12 and in $InAs_yP_{1-y}$ buffer layer 13.

Figure 3:
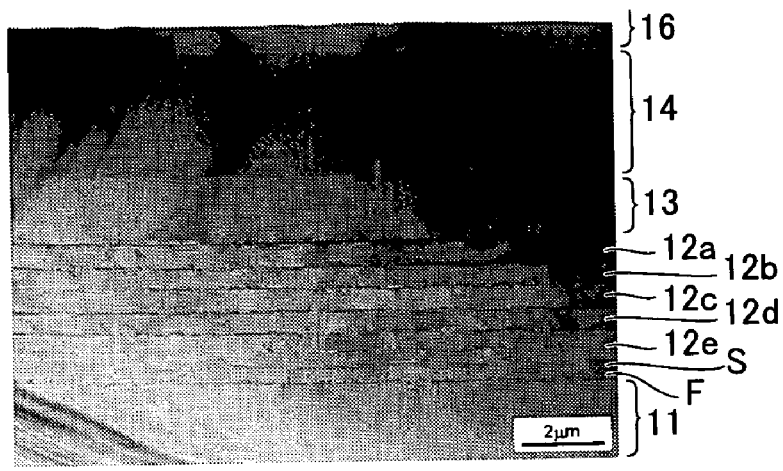
FIG. 3 is a transmission electron microscopic photograph showing a cross section of a compound semiconductor wafer (Sample 1) in accordance with the present invention.

As to the manufacturing method, when the step layers and the buffer layer are formed, growth is interrupted every time a layer is formed, so as to improve steepness of composition and lattice constant variation, as already described with reference to FIG. 2. FIG. 3 is a transmission electron microscopic photograph showing a cross section of Sample 1 of the compound semiconductor in accordance with the present invention. On InP substrate 11, first step layer F and second step layer S are formed, and five step layers 12e to 12a are formed thereon. On these step layers, buffer layer 13 is formed, and light receiving layer 14 and window layer 16 are further provided.

In Sample 1 of the present invention, PL light emission intensity of InGaAs light receiving layer 14 is very high, as will be described later. Referring to FIG. 3, brightness/darkness contrast resulting from a distortion is clearly recognized at each interface of $InAs_xP_{1-x}$ step layers. Such brightness/darkness contrast resulting from a distortion, however, is not recognized at the interface between $InAs_yP_{1-y}$ buffer layer 13 and InGaAs light receiving layer 14 or at the interface between InAsP window layer 16 and InGaAs light receiving layer 14.

Figure 4:
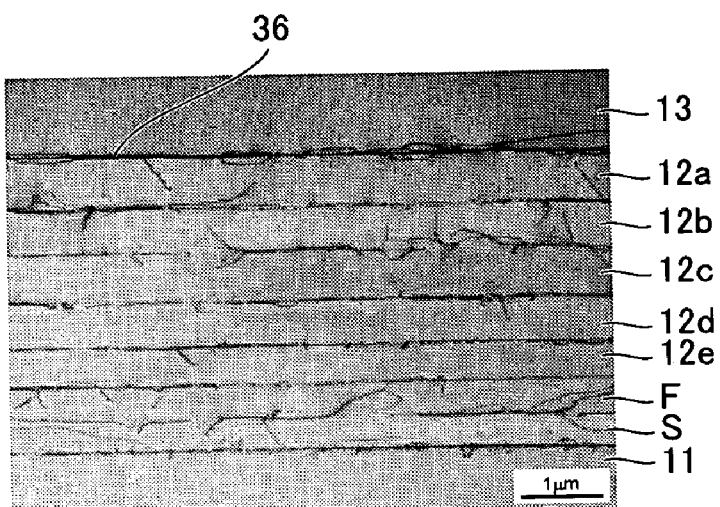
FIG. 4 is a transmission electron microscopic photograph showing a portion near the step layer of Sample 1.
Figure 5:
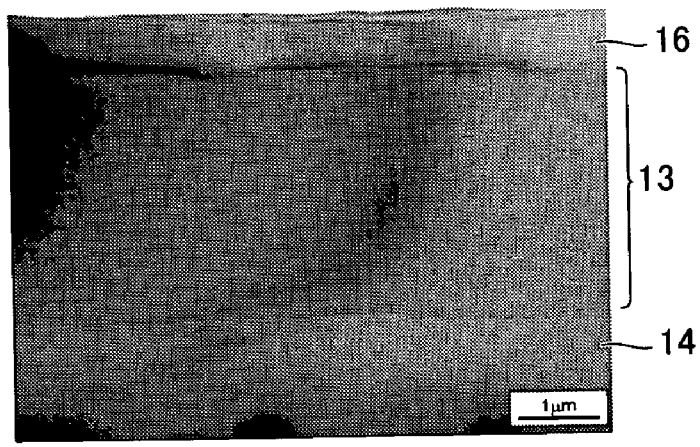
FIG. 5 is a transmission electron microscopic photograph showing a portion near the light receiving layer of Sample 1.

FIG. 4 is a transmission electron microscopic photograph showing, in enlargement, the step layers of Sample 1 in accordance with the present invention. In FIG. 4, it can be recognized that contrast 36 representing high density dislocations is formed at the interface of each step layer and extended into the step layers. On the contrary, in FIG. 5, the contrast at the interface between each of InGaAs light receiving layer 14 and adjacent $InAs_yP_{1-y}$ buffer layer 13 and InAsP window layer 16 is not clear, indicating that the density of dislocations is low.

Figure 6:
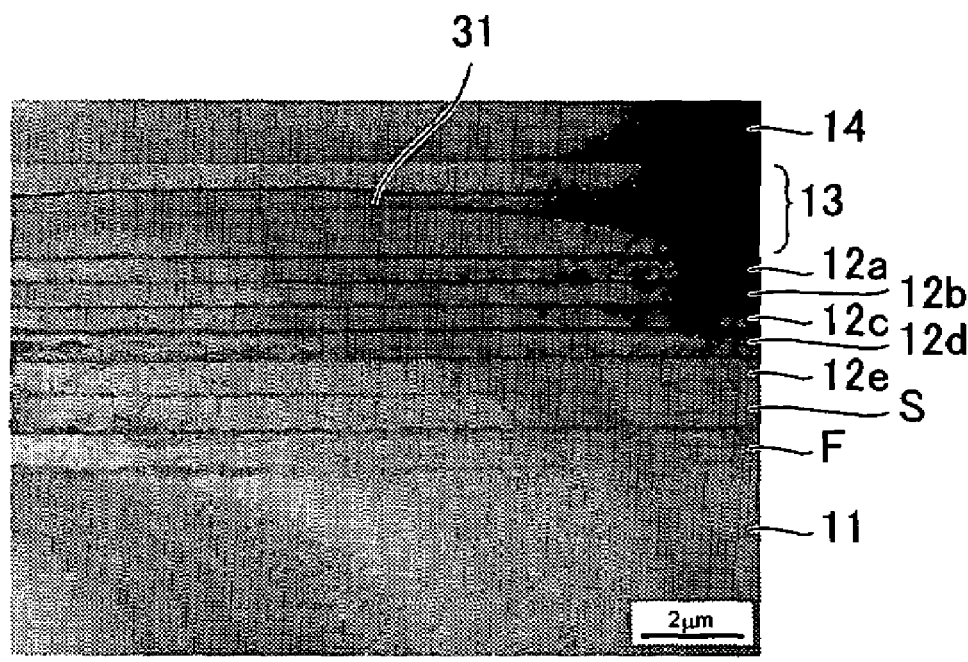
FIG. 6 is a transmission electron microscopic photograph showing a portion near the step layer of a comparative example (Sample 2).

FIG. 6 is a transmission electron microscopic photograph showing a cross section of a compound semiconductor wafer of Sample 2, which was grown without growth interruption, not considering steepness of composition variation at the interface between each of the step layers. Referring to FIG. 6, extension of dislocations from each interface of the step layers is not recognized, and the brightness/darkness contrast resulting from dislocation density is low. The magnification of FIG. 6 is approximately the same as that of FIG. 3, and therefore, by the comparison between FIGS. 3 and 6, sharper contrast at each interface of the step layers in FIG. 3 can be recognized. It is noted, however, that brightness/darkness contrast 31 resulting from distortion is recognized in $InAs_yP_{1-y}$ buffer layer 13.

Figure 7:
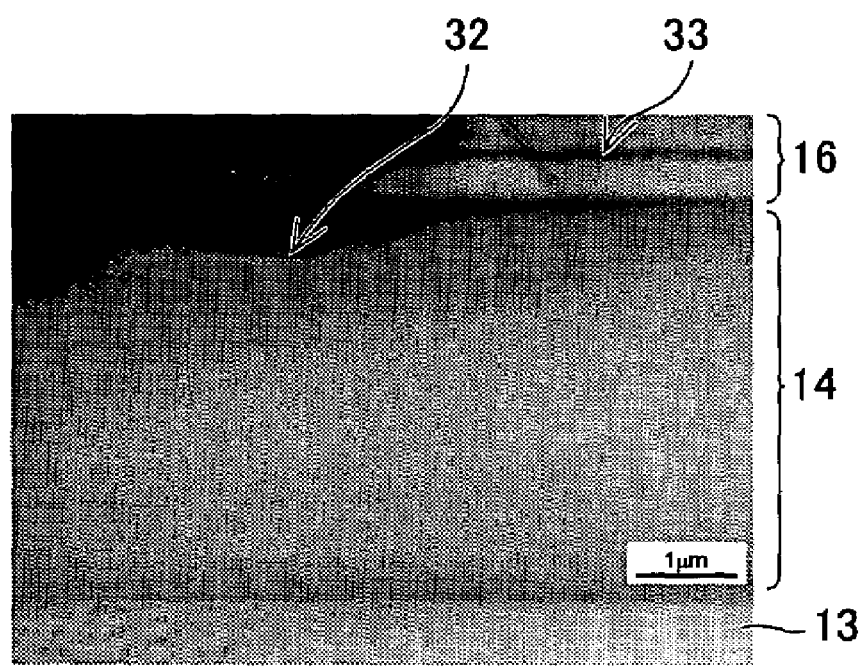
FIG. 7 is a transmission electron microscopic photograph showing a portion near the light receiving layer of Sample 2.

Referring to FIG. 7, brightness/darkness contrast 32 is recognized in InGaAs light receiving layer 14, and brightness/darkness contrast 33 is also recognized in InAsP layer 16. Further, the contrast representing the dislocation density at the interface of $InAs_yP_{1-y}$ buffer layer 13 and of InAsP window layer 16 is higher than that of FIG. 5. Specifically, it is observed in Sample 1 of the compound semiconductor wafer in accordance with the present invention, that the dislocation density at each interface of the step layers is higher than Sample 2, the dislocations are extended into each step layer, and that the dislocation density is lower at the interface of the buffer layer or the window layer adjacent to light receiving layer 14.

Figure 8:
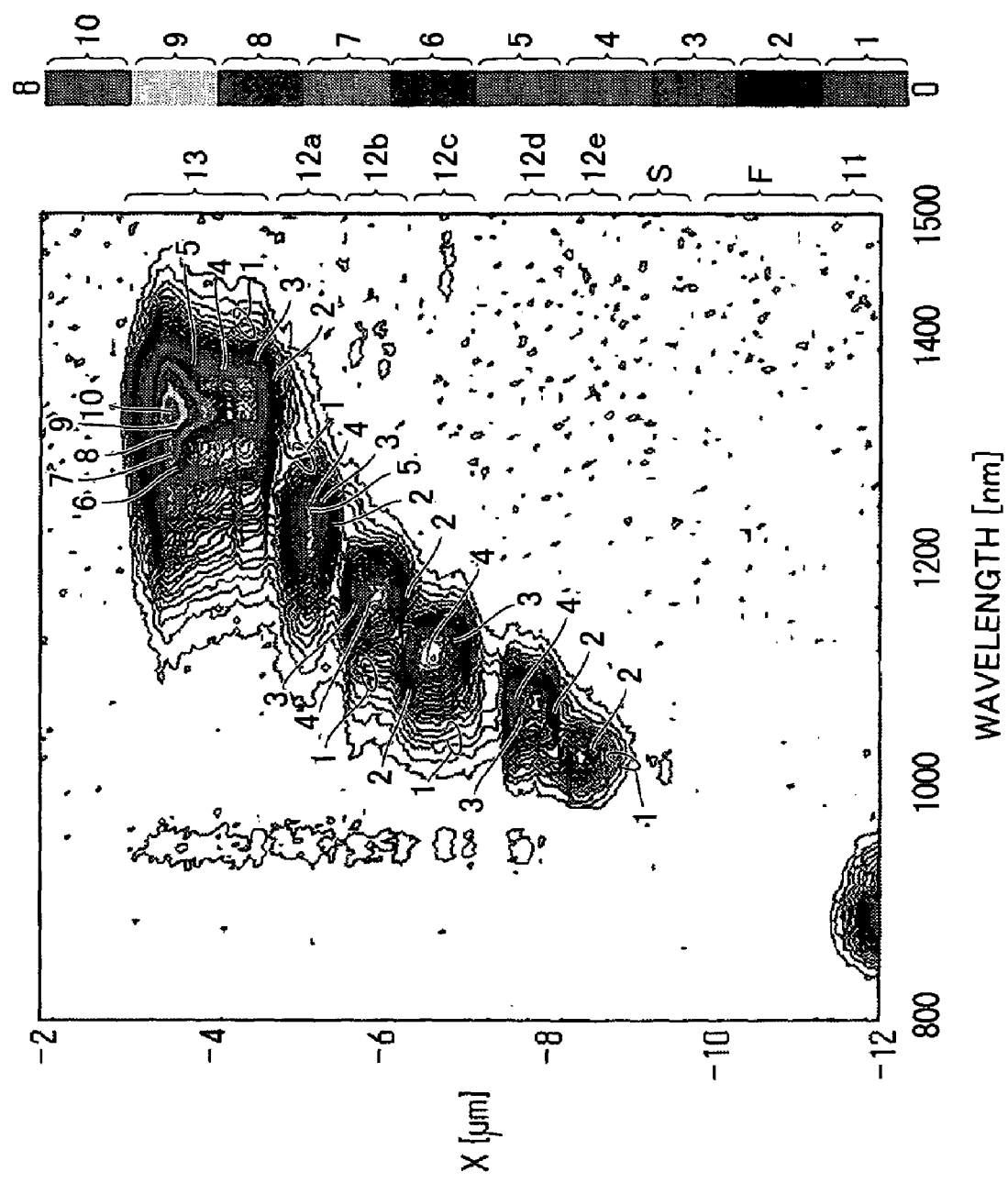
FIG. 8 shows PL light emission intensity distribution of the compound semiconductor wafer in accordance with the present invention (Sample 1).

The PL light emission intensity distribution on the cross section of Sample 1 of the compound semiconductor wafer in accordance with the present invention was measured. FIG. 8 shows the measurement result. In FIG. 8, the abscissa represents wavelength (nm) of PL light emission, and the ordinate represents length (nm) or distance from a reference position. Therefore, thickness of each layer can be known from the ordinate. The intensity of PL light emission is generally represented by colors in actual data. The intensity distribution, however, can be understood by black-and-white representation with the intensity level indicated by numerical values, as in FIG. 8.

In FIG. 8, the highest intensity of PL light emission corresponds to unit 8, and unit 8 is divided into 10 levels, as shown in the figure with corresponding numerical values. The unit of "unit 8" mentioned above is particular to the measurement apparatus. FIG. 8 shows the wavelength range covering the emission wavelength of InP substrate 11 to the emission wavelength of buffer layer 13. Specifically, the range of 2200 nm, that is the wavelength of light receiving layer 14, is not covered. The reason is as follows. In order to measure the wavelength of 2200 nm, a near-infrared sensor using a compound semiconductor wafer, that is the object of the present invention, must be used, and such a range cannot be measured unless the sensor is switched to a special sensor.

From FIG. 8, the following can be understood.

(a1) PL light emission is not observed at the first step layer F and the second step layer S. The maximum value of PL light emission intensity of the buffer layer is represented by level 10, while the intensity of first step layer F and second step layer S is, to say the least, not high enough to reach level 1. Therefore, the light emission intensity is at most smaller than level 1.

(a2) At the interface between two step layers 12b and 12c and at the interface between two step layers 12d and 12e, the maximum value at the interface, that is, level 2, is attained. The crystal characteristic at the interface is as small as 2/10, as compared with level 10 corresponding to the maximum PL light emission intensity of the buffer layer.

(a3) The PL light emission intensity within the step layers is level 3 at the highest, that is, 3/10 of the highest value of buffer layer 13.

Figure 9:
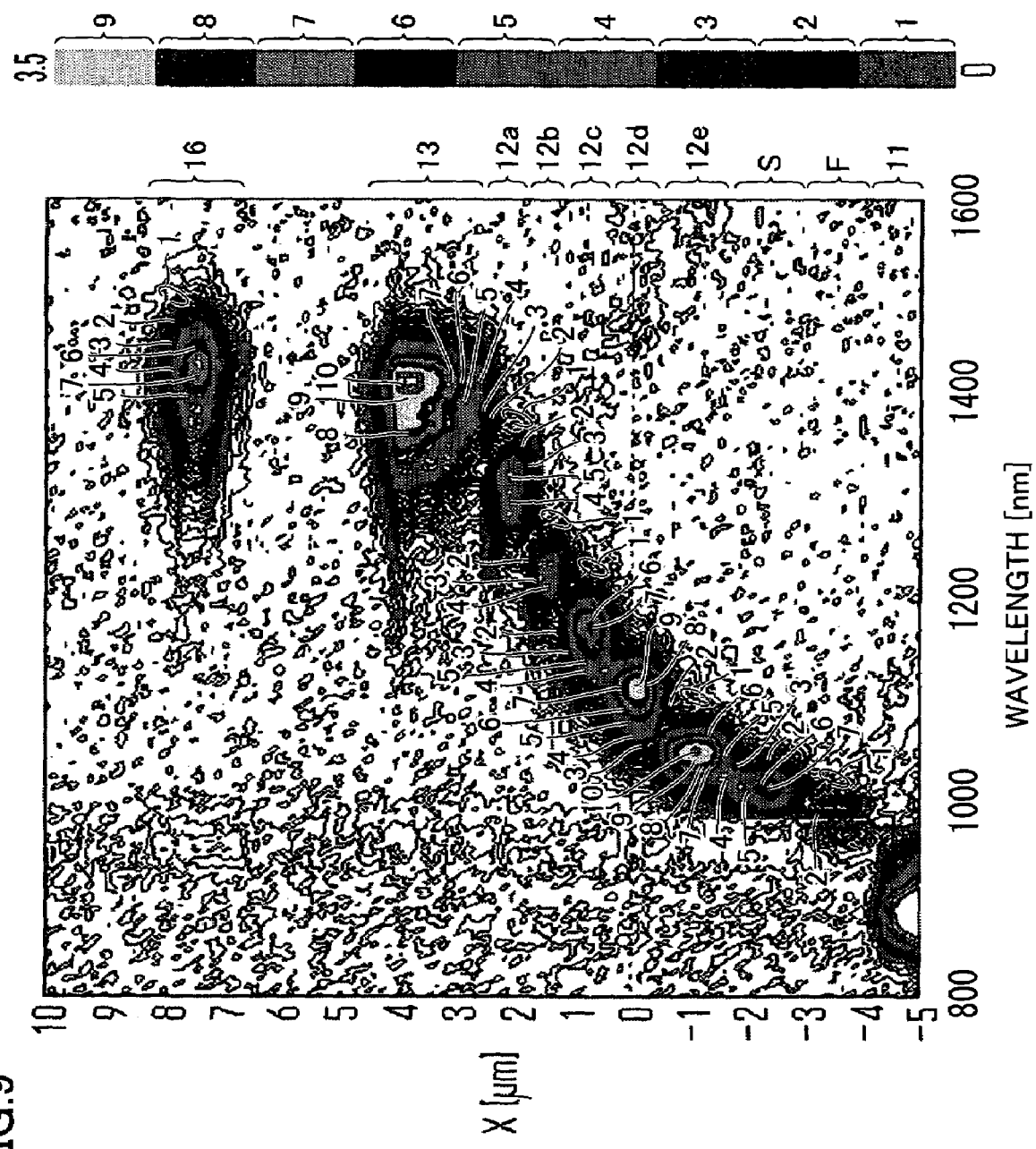
FIG. 9 shows PL light emission intensity distribution of the compound semiconductor wafer of the comparative example (Sample 2).

As a comparative example, the PL light emission intensity distribution of Sample 2 was measured, which sample of the compound semiconductor wafer was formed using the chloride VPE apparatus shown in FIG. 2, with the step layers and the buffer layer formed without growth interruption. The result of measurement is as shown in FIG. 9. In the representation given in FIG. 9, 90% of the highest intensity is regarded as unit 3.5. Namely, the highest intensity corresponds to unit 3.89 (3.5 unit/0.9). As to the unit, the PL light emission intensity in the step layer is level 3 at the highest as described above, which is smaller than that of buffer layer 13. In FIG. 9, the highest intensity of 3.89 is classified into 10 levels, as shown in the figure with corresponding numerical values. It may be considered that the sensitivity of measurement is improved in FIG. 9 than in FIG. 8. From the comparison of FIG. 9 with the example of the present invention shown in FIG. 8, the following can be understood.

(b1) PL light emission is recognized even in the first step layer F and the second step layer S. Considering the absolute value of PL light emission intensity, this result may be derived from higher sensitivity. When compared with the highest intensity of the buffer layer, however, the intensity of first step layer F is level 2 and that of the second step layer is level 7, and thus, the ratio to the highest intensity of the buffer layer is 2/10 and 7/10, respectively. Such intensity ratio is considerably different from the value of the present invention, which is smaller than 1/10.

(b2) Referring to FIG. 9, the highest value of PL light emission at the interface is level 4. Namely, the ratio to the highest value of the buffer layer is 4/10. This is significantly higher than the ratio 2/10 of the present invention.

(b3) The highest PL light emission intensity inside the step layers is level 10 of step 12e, which is the same as the highest level of buffer layer 13. The ratio is 10/10, that is, 1. This is a big difference between the example of the present invention and the comparative example.

As to the PL light emission intensity of the light receiving layer, which is the most important, is given by the ratio to the comparative example, in accordance with the following equation.

(maximum intensity of PL light emission intensity of light receiving layer 14 of the wafer shown in FIG. 8)/(maximum intensity of PL light emission intensity of light receiving layer of the wafer shown in FIG. 9)=16/1.

From the foregoing, it follows that light receiving layer 14 of the compound semiconductor wafer in accordance with the present invention has 16 times higher light receiving sensitivity than the light receiving layer of the comparative example. It is not simply the case that the defect density of the example in accordance with the present invention is reduced to 1/16 that of the comparative example. It is noted, however, that the defect density in the light receiving layer of the present invention is remarkably reduced from that of the comparative example, and the light receiving layer having superior crystal characteristic is obtained. As a result, dark current can be reduced significantly, and the sensitivity in the near-infrared range can remarkably be improved.

Figure 10:
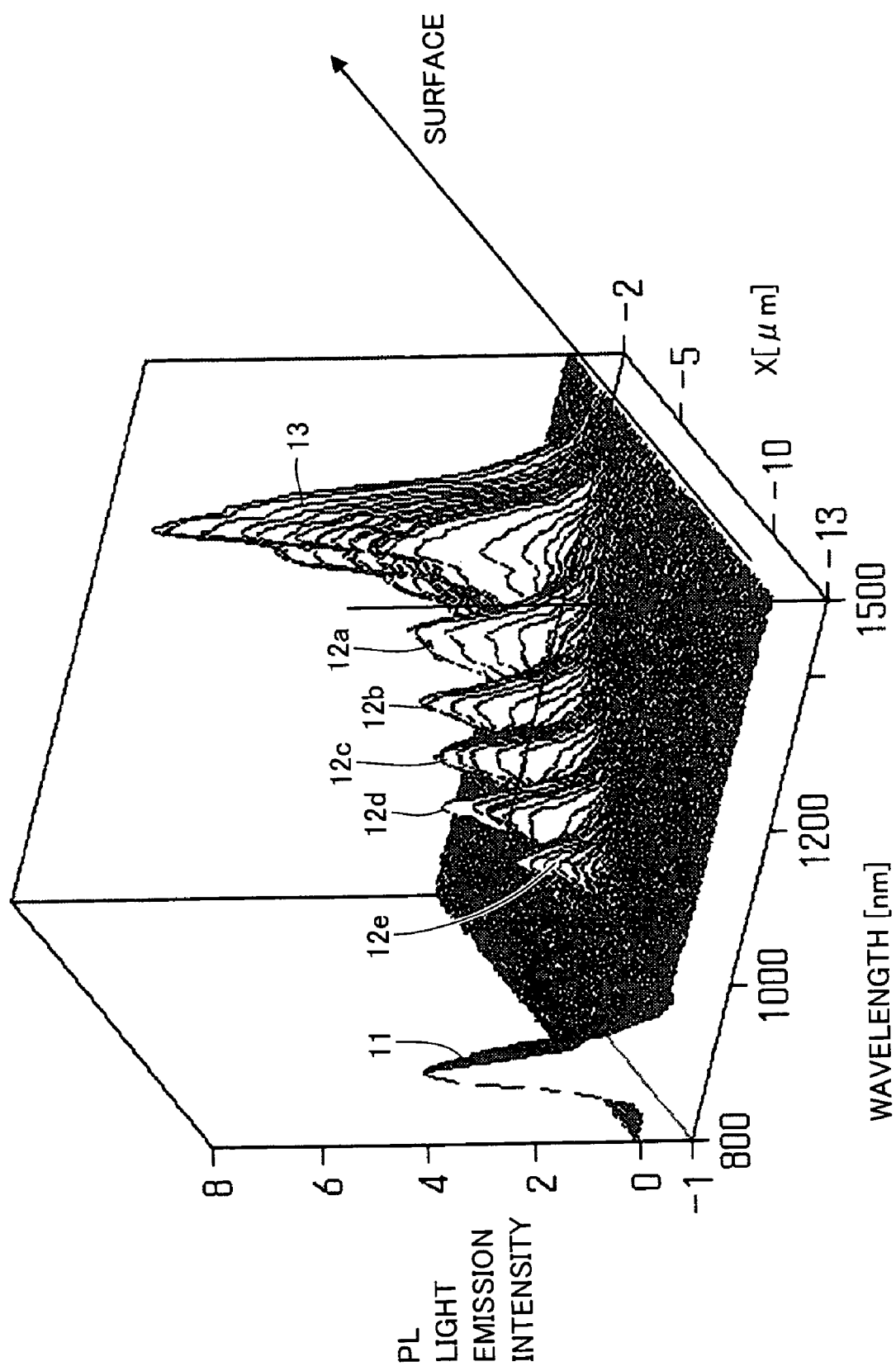
FIG. 10 three-dimensionally shows PL light emission intensity distribution of the compound semiconductor wafer in accordance with the present invention.

FIG. 10 represents the PL light emission intensity in a three-dimensional manner, with the PL light emission intensity of the example in accordance with the present invention shown in FIG. 8 plotted along the vertical axis. The maximum PL light emission intensity in the step layer is about 40% of the maximum PL light emission intensity of the buffer layer, matching the representation of FIG. 8.

Figure 11:
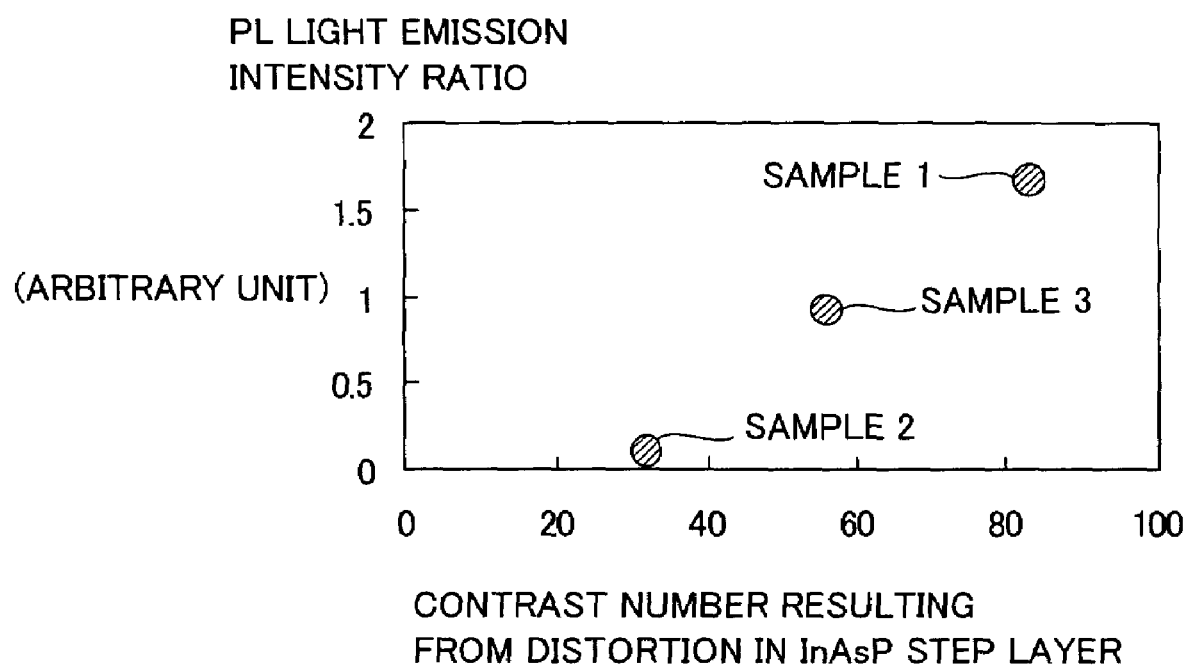
FIG. 11 represents relation between PL light emission intensity ratio and contrast number resulting from distortion in the step layer.

FIG. 11 represents contrast number resulting from distortion in the $InAs_xP_{1-x}$ step layer in a prescribed range on the abscissa, and represents PL light emission intensity ratio of InGaAs light receiving layer 14 on the ordinate, plotted for Samples 1 to 3. Sample 2 is a compound semiconductor wafer not belonging to the present invention, which is almost free of any growth interruption and in which steepness in composition variation is not so strictly managed as in Sample 1.

Referring to FIG. 11, the contrast number resulting from distortion in the step layer is in proportion to the PL light emission intensity in the light receiving layer, and it can be understood that the larger the contrast number resulting from distortion in the step layer, the higher the PL light emission intensity in the light receiving layer. This relation well matches the mechanism described above, that is, misfit dislocations in layers lower than the light receiving layer are not transferred or extended to the light receiving layer but locally held at the interfaces and inside the step layers, so that crystal characteristic of the light receiving layer is improved and the PL light emission intensity is improved.

Figure 12:
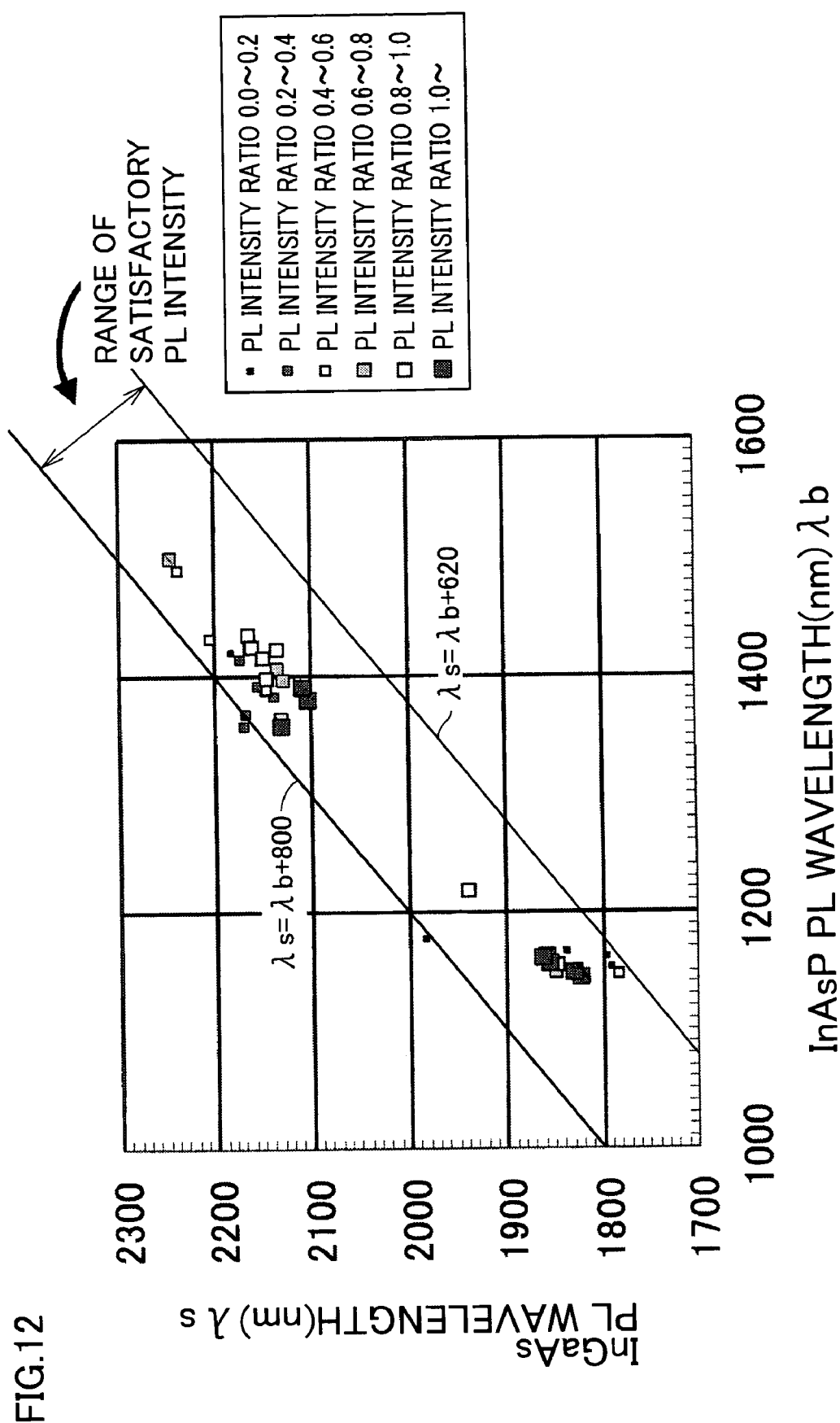
FIG. 12 represents relation between the PL light emission wavelength of light receiving layer and buffer layer of the compound semiconductor wafer, specifying the range in which the light receiving layer has superior crystal characteristic.

FIG. 12 represents relation between the PL light emission wavelength λs of InGaAs light receiving layer 14 and PL light emission wavelength λb of InAsP buffer layer 13, specifying the range in which the light receiving layer has high PL light emission intensity. The examples described above are also plotted as points within this range. This range can be represented as λs−800 nm≦λb≦λs−620 nm. When this relation is satisfied, it is considered that misfit dislocation is not likely between a lattice of the InGaAs light receiving layer and the lattices of InAsP buffer layer as well as InAsP window layer.

When a compound semiconductor wafer is actually manufactured, the wafer that satisfies the range shown in FIG. 12 can be manufactured through the following steps.

(s1) First, the wavelength of light to be received by light receiving layer 14 is determined. This is none other than determination of wavelength as the object of the sensor. Further, it is the same as determination of the PL light emission wavelength. Determination of PL light emission wavelength is equivalent to determination of band gap, and therefore, composition and lattice constant are also determined naturally.

(s2) PL light emission wavelength of buffer layer 13 is determined based on FIG. 12. This is the same as determination of PL light emission wavelength of window layer 16. Therefore, composition and lattice constant of the buffer layer and of the window layer are determined.

(s3) From the lattice constant of the buffer layer determined in (s2) and from the lattice constant of InP substrate, the number of step layers to be inserted and lattice constants thereof are designed. The design of lattice constants also involves composition design.

Through the steps (s1) to (s3) described above, the relation of PL light emission intensity of the light receiving layer and the buffer layer shown in FIG. 12 can be satisfied. As a result, a light receiving layer having superior crystal characteristic can be obtained, and a highly sensitive near-infrared sensor with small dark current can be obtained.

Figure 13:
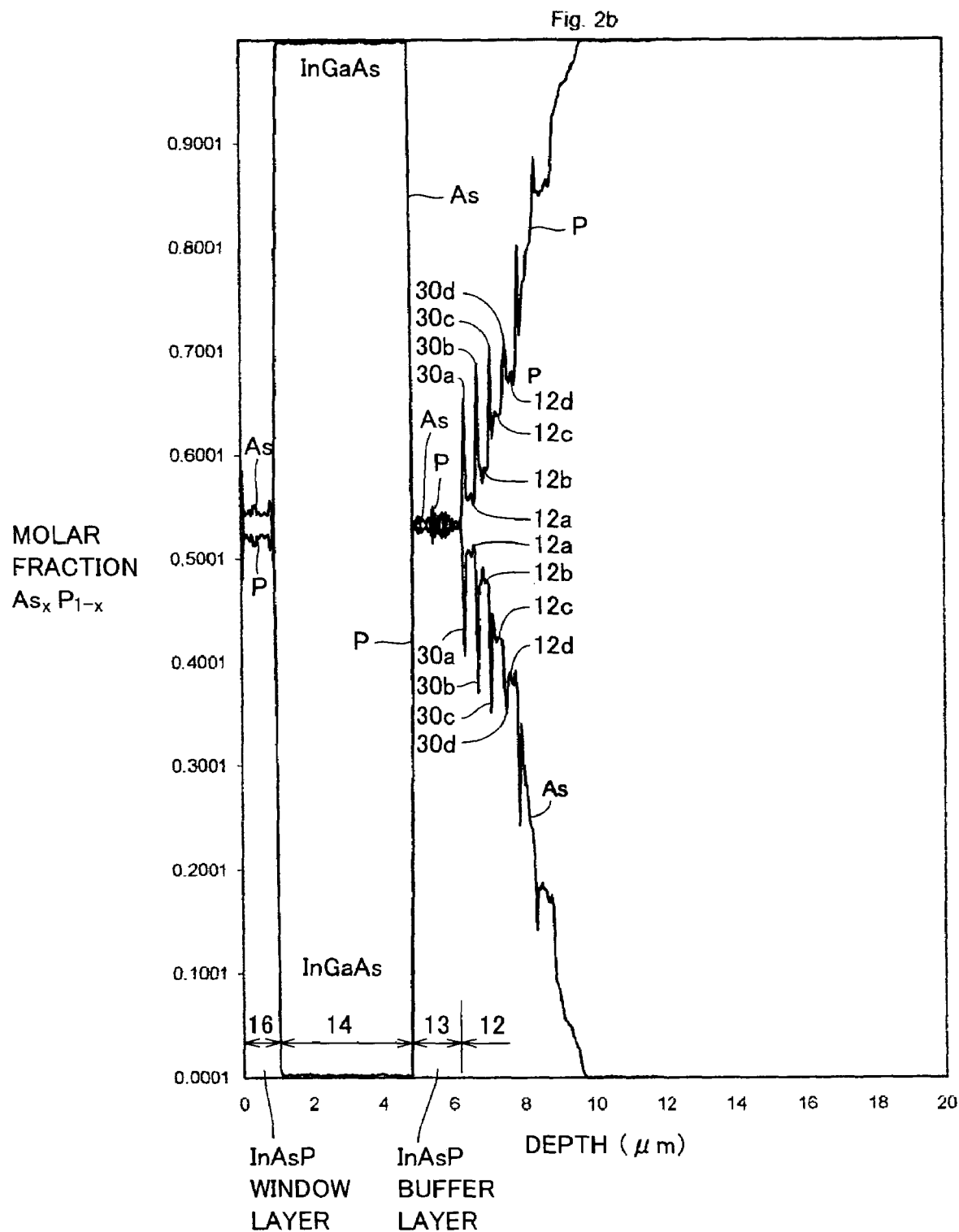
FIG. 13 shows a result of SIMS analysis of Sample 1 in accordance with the present invention.

The result of SIMS (Secondary Ion Mass Spectroscopy) on cross sections of Sample 1 (present invention) and Sample 2 (comparative example) will be described in the following. SIMS enables mass spectrometry of a small portion, and therefore, mass spectroscopy of the interface at each step layer, which is important in the embodiment of the present invention, is possible. FIG. 13 is a chart representing the result of SIMS analysis of Sample 1 (present invention). Referring to FIG. 13, it can be seen that step layer 12 includes step layers 12a, 12b, 12c, 12d with compositions of $InAs_xP_{1-x}$ varied layer by layer. Specifically, the composition ratio of P in $InAs_xP_{1-x}$ decreases from InP substrate 11 to buffer layer 13, while the composition ratio of As in $InAs_xP_{1-x}$ increases from InP substrate 11 to buffer layer 13. This is to adjust the lattice constant gradually from InP substrate 11 to buffer layer 13.

At the interfaces 30a, 30b, 30c, 30d and the like of these step layers, P and As composition ratios represent variations that are adverse to the composition variation described above. Specifically, the peak composition ratio of As and P at the interface of a step layer is closer to the composition ratio of the InP substrate than the composition ratio of As and P of a preceding step layer, that is, the step layer closer by one to the InP substrate. At the interface, the composition does not become closer to the composition of the buffer layer but rather it has the reverse tendency.

Figure 14:
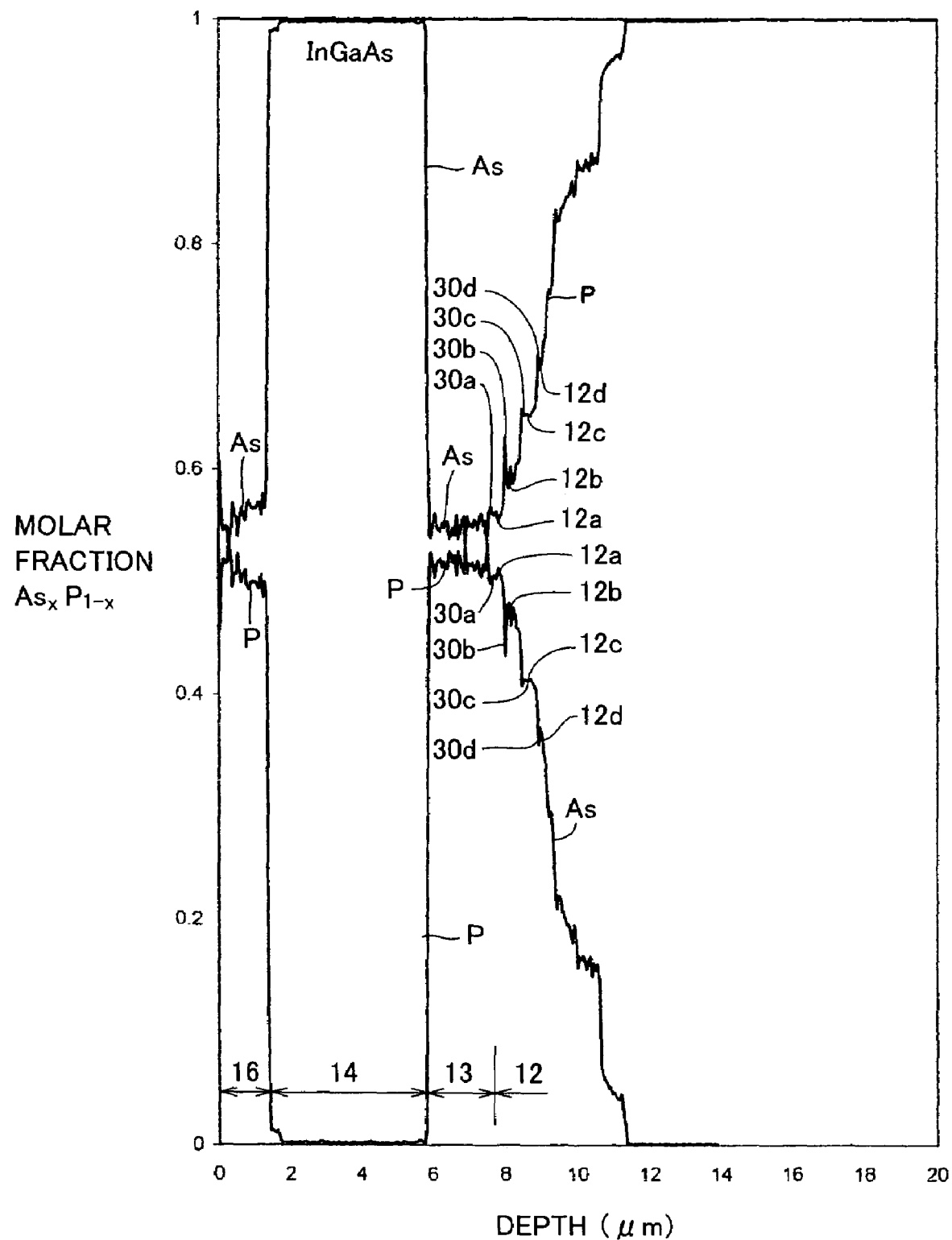
FIG. 14 shows a result of SIMS analysis of Sample 2 of the comparative example.

FIG. 14 is a chart representing the result of SIMS analysis of Sample 2 (comparative example). From this result, it can be seen that though the composition ratio of As and P vary at the interface of a step layer, there is no interface of which composition ratio peak value is closer to that of the InP substrate than that of a preceding step layer.

It can be concluded from the comparison between FIGS. 13 and 14, that the peak of composition ratio of As and P at the interface of a step layer is closer to the composition ratio of the InP substrate to the extent as described above, because of the function of growth interruption. The variation of composition ratio at the interface results from the interruption of growth that caused steep composition variation between each of the layers, and it involves concentration of misfit dislocations.

Specifically, the lattice constant and the composition ratio are in one-to-one correspondence, and therefore, adverse variation in composition ratio at the interface mentioned above also means adverse variation in lattice constant, establishing concentration of misfit dislocations. When the misfit dislocations are concentrated to a higher degree at the interface, the number of misfit dislocations decreases in the step layers and in the buffer layer, facilitating formation of a light emitting layer having superior crystal characteristic.

ADDITIONAL COMMENTS ON THE EMBODIMENT

1. In the present embodiment, wafer examples that satisfy all of the following conditions (c1) to (c3) have been described.

(c1) Wafers in which maximum PL light emission intensity at the interface of each of the plurality of step layers and the buffer layer is, at every interface, smaller than 3/10 of the maximum PL light emission intensity of the buffer layer.

(c2) Wafers in which the maximum PL light emission intensity of the plurality of step layers is not larger than 7/10 of the maximum PL light emission intensity of the buffer layer.

(c3) Wafers in which the maximum PL light emission intensity of at least the first step layer positioned on and in contact with the InP substrate among the plurality of step layers is smaller than 1/10 of the maximum PL light emission intensity of the buffer layer.

It is noted, however, that the wafer of the present invention, in its broadest scope, have only to satisfy one of the conditions (c1) to (c3).

2. In the present embodiment, when the growth is to be interrupted, supply of the material gas is stopped by using a protection plate, to increase steepness at the interface. The method of interrupting growth is not limited to this method, and any method may be used provided that the material gas of different compositions can be supplied to the substrate for forming different step layers.

Modifications of the embodiment of the present invention will be briefly described, also with reference to features already described in the embodiment above.

In every compound semiconductor wafer in which PL light emission intensity of the buffer layer is defined to be higher by a prescribed value or more than the PL light emission intensity of other portions, the lattice constant of the buffer layer and the lattice constant of the light receiving layer may be determined such that the PL light emission wavelength $\lambda b$ of the buffer layer and the PL light emission wavelength $\lambda s$ of the light receiving layer satisfy the relation of $\lambda s-800$ nm $\leq \lambda b \leq \lambda s-620$ nm.

When the relation of PL light emission intensity described above is satisfied between an underlying layer and the light receiving layer formed on the underlying layer, the relation of lattice constants between the underlying layer and the light receiving layer is determined uniquely from the relation of PL light emission wavelength. By selecting the compositions of the buffer layer and of the light receiving layer to satisfy the relation of lattice constants that realizes the relation of PL light emission wavelength described above, and by stacking such layers, a light receiving layer having superior crystal characteristic can be obtained. The reason, however, is not known.

In order to have the PL light emission wavelengths of the buffer layer and of the light receiving layer satisfy the relation described above, the step layers and the buffer layer must have such composition sequences that enables the relation described above.

The PL light emission wavelength of the light receiving layer described above may be 1700 nm or longer. By selecting the composition to attain the desired wavelength, a near-infrared sensor can be obtained.

In every compound semiconductor wafer in which the peak value of composition ratio of As and/or P at the interface is defined, at the interface between the buffer layer and the step layer, the peak value of composition ratio of As and/or P may be made closer to the corresponding composition ratio of the InP substrate than that of a step layer that is in contact with the interface on the InP substrate side and that of a step layer that is in contact with the step layer on the InP substrate side.

Further, both at the interface between the buffer layer and the step layer and at the interface between step layers closer to that interface, the peak value of composition ratio of As and/or P may be made closer to the corresponding composition ratio of the InP substrate than that of a step layer that is in contact with the interface on the InP substrate side and that of a step layer that is in contact with the step layer on the InP substrate side. Further, at all three of the interface between the buffer layer and the step layer, the interface between step layers closest to that interface and the interface between step layers second closest to that interface, the peak value of composition ratio of As and/or P may be made closer to the corresponding composition ratio of the InP substrate than that of a step layer that is in contact with the interface on the InP substrate side and that of a step layer that is in contact with the step layer on the InP substrate side.

As described above, as misfit dislocations are concentrated at interfaces closer to the buffer layer, crystal characteristic of the buffer layer and the light receiving layer can be improved.

In every compound semiconductor wafer in which PL light emission intensity of the buffer layer is defined to be higher by a prescribed value or more than the PL light emission intensity of other portions, and in every compound semiconductor wafer in which the peak value of composition ratio of As and/or P at the interface is defined, an n-type impurity of at least 1E+18 may be introduced to the $InAs_xP_{1-x}$ step layer consisting of the plurality of layers described above and to the $InAs_yP_{1-y}$ buffer layer. Introduction of the impurity suppresses extension and propagation of defects to adjacent layers.

When the $InAs_xP_{1-x}$ step layer including the plurality of layers and the $InAs_yP_{1-y}$ buffer layer are formed, growth may be interrupted every time a layer is formed.

By the growth interruption mentioned above, the steepness of layer-by-layer composition change can be improved. As a result, steepness in lattice constant variation can also be improved. When the steepness in lattice constant variation becomes higher at an interface, it follows that the lattice constant varies stepwise from one layer to the other layer. In such a case, misfit dislocations generated at a lower layer are blocked at the portion where the lattice constant varies stepwise, and prevented from extending and propagating to the upper layer.

Therefore, different from an example in which growth is not interrupted and the composition varies continuously, the defect density is not released at the interface as the underlying layer. However, an epitaxial film free of defect extension or propagation from the underlying layer to the InGaAs light receiving layer can be obtained. As a result, an epitaxial layer having superior crystal characteristic can be obtained when the film has at least a prescribed thickness.

On a rear surface of the InP substrate opposite to the front surface on which the above-described light receiving layer is formed, similar layers as those on the front surface may be formed. This structure prevents warp of the wafer.

In the method of manufacturing the compound semiconductor wafer in accordance with the present invention, when the $InAs_xP_{1-x}$ step layer and the $InAs_yP_{1-y}$ buffer layer are formed, such a film forming apparatus may be used that has a film forming space in which the material gas is directed to the substrate for manufacturing and a saving space to which the substrate is retreated from the film forming space, and when the growth is to be interrupted, the compound semiconductor wafer that is being manufactured may be retreated from the film forming space to the saving space.

According to this method, steepness in composition variation can be improved when a film is to be formed with its composition varied from that of the preceding layer. Further, steepness in lattice constant variation can also be improved, and propagation or extension of defects including misfit dislocations to an upper layer can be suppressed.

Further, when the $InAs_xP_{1-x}$ step layer and the $InAs_yP_{1-y}$ buffer layer are formed, a growing apparatus having two growth chambers may be used, and when the growth is to be interrupted in each chamber, a protection plate may be placed so that material gas supply to the substrate is stopped.

According to this method, the material gas can be supplied and stopped instantly, and steepness in composition variation at the interface can easily be established.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

By the compound semiconductor wafer and manufacturing method thereof in accordance with the present invention, an InGaAs light receiving layer having superior crystal characteristic formed on an InP substrate can be obtained, and hence a highly sensitive near-infrared sensor with small dark current can be obtained. Thus wide applications mainly for near-infrared sensor are expected.

The invention claimed is:

1. A compound semiconductor wafer comprising:
   an InP substrate;
   a multi-layered structure consisting of a plurality of step layers comprising $InAs_xP_{1-x}$ arranged successively on said substrate;
   a buffer layer comprising $InAs_yP_{1-y}$ arranged on said multi-layered structure, with said multi-layered structure between said buffer layer and said substrate; and
   a light receiving layer comprising $In_zGa_{1-z}As$ arranged on said buffer layer, with said buffer layer between said light receiving layer and said multilayered structure;
   wherein:
   said step layers include at least a first step layer (12a), a second step layer (12b) and a third step layer (12c) arranged successively in order between said buffer layer and said substrate with said first step layer (12a) relatively closer to said buffer layer and said third step layer (12c) relatively closer to said substrate;
   respective interfaces (30a, 30b, 30c, 30d) comprising $InAs_xP_{1-x}$ are formed between said buffer layer and said multi-layered structure, and between successive ones of said step layers;
   said interfaces include a first interface (30a) on a side of said first step layer (12a) facing toward said buffer layer, a second interface (30b) between said first step layer (12a) and said second step layer (12b), and a third interface (30c) between said second step layer (12b) and said third step layer (12c);
   among said first, second and third step layers, said first step layer has a relatively highest value of said x, said second step layer has a middle value of said x, and said third step layer has a relatively lowest value of said x of said $InAs_xP_{1-x}$;
   said y of said $InAs_yP_{1-y}$ of said buffer layer is higher than said relatively highest value of said x of said first step layer; and
   a value of said x of said $InAs_xP_{1-x}$ in said first interface (30a) is lower than said middle value of said x of said second step layer (12b), and/or a value of said x of said $InAs_xP_{1-x}$ in said second interface (30b) is lower than said relatively lowest value of said x of said third step layer (12c).

2. The compound semiconductor wafer according to claim 1, wherein said value of said x of said $InAs_xP_{1-x}$ in said first interface is lower than said middle value of said x of said second step layer, and said value of said x of said $InAs_xP_{1-x}$ in said second interface is lower than said relatively lowest value of said x of said third step layer.

3. The compound semiconductor wafer according to claim 2, wherein said step layers further include a fourth step layer adjacent to said third step layer with a fourth interface of said interfaces therebetween, and wherein a value of said x of said $InAs_xP_{1-x}$ in said third interface is lower than a value of said x of said $InAs_xP_{1-x}$ of said fourth step layer.

4. The compound semiconductor wafer according to claim 1, wherein said value of said x of said $InAs_xP_{1-x}$ in said first interface is lower than said relatively lowest value of said x of said third step layer.

5. The compound semiconductor wafer according to claim 1, wherein said first interface is located directly between and adjoining said buffer layer and said first step layer.

6. The compound semiconductor wafer according to claim 1, wherein said step layers comprise said $InAs_xP_{1-x}$ and further comprise an n-type impurity in a concentration of at least 1E+18, and wherein said buffer layer comprises said $InAs_yP_{1-y}$ and further comprises said n-type impurity in a concentration of at least 1E+18.

7. The compound semiconductor wafer a according to claim 1, wherein said interfaces have such characteristics as result from respectively interrupting a growth process that forms said step layers and said buffer layer in succession.

8. A compound semiconductor wafer (50) including an $In_zGa_{1-z}As$ layer (14) as a light receiving layer formed on an InP substrate (11), comprising:
   an $InAs_xP_{1-x}$ step layer structure consisting of a plurality of step layers (12a, 12b, 12c, 12d, 12e) formed in contact with and on said InP substrate and an $InAs_yP_{1-y}$ buffer layer (13) positioned in contact with and on the step layer structure, sandwiched between said InP substrate (11) and said $In_zGa_{1-z}As$ layer (14); wherein
   said plurality of step layers and said buffer layer have mutually different lattice constants that vary successively from that of said InP substrate to that of said $In_zGa_{1-y}As$ layer;

at least one interface of each interface (30b to 30e) between two adjacent step layers out of said plurality of step layers (12a, 12b, 12c, 12d, 12e) and an interface (30a) between said buffer layer (13) and an uppermost step layer out of the plurality of step layers is identified as a first interface (30a), the step layer in contact with said first interface on a side thereof toward said InP substrate (11) is identified as a first step layer (12a), and another step layer of said step layers in contact with said first step layer on the side thereof toward said InP substrate (11) is identified as a second step layer (12b), and an absolute value of a difference between a peak composition ratio of As and/or P at said first interface (30a) and a corresponding composition ratio of said InP substrate is smaller than an absolute value of a difference between the composition ratio of said first step layer (12a) and the corresponding composition ratio of said InP substrate and an absolute value of a difference between the composition ratio of said second step layer (12b) and the corresponding composition ratio of said InP substrate.

9. The compound semiconductor wafer according to claim 8, wherein said first interface refers to an interface between said buffer layer and the uppermost step layer out of said plurality of step layers, said first step layer refers to the uppermost step layer (12a) out of said plurality of step layers, and said second step layer refers to the step layer (12b) in contact with the uppermost step layer (12a) out of said plurality of step layers on the side thereof toward said InP substrate.

10. The compound semiconductor wafer according to claim 8, wherein said first interface refers to an interface between said buffer layer and the uppermost step layer out of said plurality of step layers, said first step layer refers to the uppermost step layer (12a) out of said plurality of step layers, said second step layer refers to the step layer (12b) in contact with the uppermost step layer (12a) out of said plurality of step layers on the side thereof toward the InP substrate, the step layer (12c) in contact with said second step layer on the side thereof toward the InP substrate is identified as a third step layer, an interface between said first step layer and said second step layer is identified as a second interface (30b), and an absolute value of a difference between a peak composition ratio of As and/or P at said second interface (30b) and a corresponding composition ratio of said InP substrate is smaller than an absolute value of a difference between the composition ratio of said second step layer (12b) and the corresponding composition ratio of said InP substrate and an absolute value of a difference between the composition ratio of said third step layer (12c) and the corresponding composition ratio of said InP substrate.

11. The compound semiconductor wafer according to claim 8, wherein said first interface refers to an interface between said buffer layer and the uppermost step layer out of said plurality of step layers, said first step layer refers to the uppermost step layer (12a) out of said plurality of step layers, said second step layer refers to the step layer (12b) in contact with the uppermost step layer (12a) out of said plurality of step layers on the side thereof toward the InP substrate, the step layer (12c) in contact with said second step layer on the side thereof toward the InP substrate is identified as a third step layer, the step layer (12d) in contact with said third step layer on the side thereof toward the InP substrate is identified as a fourth step layer, an interface between said first step layer and said second step layer is identified as a second interface (30b), an interface between said second step layer and said third step layer is identified as a third interface (30c), an absolute value of a difference between a peak composition ratio of As and/or P at said second interface (30b) and a corresponding composition ratio of said InP substrate is smaller than an absolute value of a difference between the composition ratio of said second step layer (12b) and the corresponding composition ratio of said InP substrate and an absolute value of a difference between the composition ratio of said third step layer (12c) and the corresponding composition ratio of said InP substrate, and an absolute value of a difference between peak composition ratio of AS and/or P at said third interface (30c) and a corresponding composition ratio of said InP substrate is smaller than an absolute value of a difference between the composition ratio of said third step layer (12c) and the corresponding composition ratio of said InP substrate and an absolute value of a difference between the composition ratio of said fourth step layer (12d) and the corresponding composition ratio of said InP substrate.

12. The compound semiconductor wafer according to claim 8, wherein an n-type impurity of at least 1E+18 concentration is introduced into said step layer structure consisting of the plurality of step layers and into said buffer layer.

13. The compound semiconductor wafer according to claim 8, wherein growth is interrupted every time a layer is formed, in forming said step layer structure consisting of the plurality of step layers and said buffer layer.

* * * * *

UNITED STATES PATENT AND TRADEMARK OFFICE
CERTIFICATE OF CORRECTION

| | | |
|---|---|---|
| PATENT NO. | : 7,307,290 B2 | Page 1 of 1 |
| APPLICATION NO. | : 10/514973 | |
| DATED | : December 11, 2007 | |
| INVENTOR(S) | : Iwasaki et al. | |

It is certified that error appears in the above-identified patent and that said Letters Patent is hereby corrected as shown below:

Title page,
Item [56], OTHER PUBLICATIONS,
Lines 3 and 4, replace "JouRNAL of Lightwave Technology, vol. 10," by --JOURNAL OF LIGHTWAVE TECHNOLOGY, Vol. 10--;

Column 5,
Line 1, after "between the", delete ".";

Column 7,
Line 5, after "FIG. 2." insert a paragraph;

Column 13,
Line 58, after "comprising", replace "$In_z Ga_{1-2}As$" by --$In_z Ga_{1-z}As$--;
Line 60, after "said", replace "multilayered" by --multi-layered--;

Column 14,
Line 49, before "and further", replace "$InAs_x P_{1-y}$" by --$InAs_y P_{1-y}$--;
Line 51, after "wafer", delete "a";
Line 63, after "said", replace "$In_xGa_{1-z}As$" by --$In_z Ga_{1-z} As$--;
Line 67, before "layer", replace "$In_zGa_{1-y}As$" by --$In_z Ga_{1-z} As$--.

Signed and Sealed this

Ninth Day of June, 2009

JOHN DOLL
*Acting Director of the United States Patent and Trademark Office*